United States Patent [19]

Daubin et al.

[11] Patent Number: 4,668,915

[45] Date of Patent: May 26, 1987

[54] NON-UNIFORM FIELD MAGNETIC RESONANCE DUAL PATIENT IMAGING SYSTEM

[75] Inventors: Scott C. Daubin, Key Biscayne; Carl G. Coin, Jupiter, both of Fla.

[73] Assignee: Honda Giken Kogyo Kabushiki Kaisha, Tokyo, Japan

[21] Appl. No.: 712,167

[22] Filed: Mar. 15, 1985

[51] Int. Cl.[4] ............................................. G01R 33/20
[52] U.S. Cl. ................................... 324/309; 324/312; 324/318
[58] Field of Search ............... 324/307, 309, 312, 318; 128/653

[56] References Cited

U.S. PATENT DOCUMENTS

| 4,070,611 | 1/1978 | Ernst | 324/309 |
|---|---|---|---|
| 4,165,479 | 8/1979 | Mansfield | 324/309 |
| 4,506,222 | 3/1985 | Edelstein et al. | 324/309 |
| 4,528,510 | 7/1985 | Loeffler et al. | 324/309 |
| 4,591,789 | 5/1986 | Glover et al. | 324/313 |

OTHER PUBLICATIONS

Wright, "Time–Sharing Control of Several Spectrometers by a Simple Computer", Journal of Magnetic Resonance, vol. 33, No. 2, 1979.

Primary Examiner—Stewart J. Levy
Assistant Examiner—Kevin D. O'Shea
Attorney, Agent, or Firm—Lyon & Lyon

[57] ABSTRACT

This patent is directed to a system which uses NMR techniques for three dimensional imaging of living organisms and in which the static and gradient fields not be uniform. It incorporates an image data processing scheme that permits single static and gradient magnetic field sources to image two different objects or patients concurrently through the use of a data processing technique which sorts and routes imaging data from separate sets of sensing devices in response to two separate control and display means to provide control inputs for the common magnetic field sources while controlling data extraction from separate, independent image data receiving probe systems. Response of the two probe systems to the common magnetic field sources is achieved through non-uniform field analysis techniques of the data received through the individual probe systems.

23 Claims, 12 Drawing Figures

NON-UNIFORM FIELD MAGNETIC RESONANCE DUAL PATIENT IMAGING SYSTEM

THE INVENTION

This invention relates to the field of radiology, and specifically to the field of imaging living organisms by the process known as "nuclear magnetic resonance imaging" or "NMR". It also relates to a tomographic process for dual patient imaging using non-uniform field analysis wherein a single imaging energy system is processed by a plurality of separate imaging energy receivers and associated image data processors.

BACKGROUND OF THE INVENTION

Tomography, the three dimensional imaging of living organisms originally utilized X-ray techniques to achieve desired goals. Therefore, due to the radiation hazards created by the large amounts of X-ray radiation required, this important, non-invasive tool has not been used to its fullest potential. However, the evolution of nuclear magnetic resonance (NMR) spectrometers into imaging systems has provided a means for imaging living organisms without the hazardous radiation of X-ray systems and the development of compact and inexpensive computer systems through integrated circuit techniques has provided the basic technological tools from which a safe, graphic system may be created.

NMR imaging systems have been developed by numerous organizations and comprehensive papers on the subject have been published, see for instance "Proceedings of the IEE", Vol. 71, No. 3, which is devoted exclusively to technical papers on computerized tomography, which includes NMR imaging. At the present time, several commercial firms (e.g. Elscint, Siemens and Diasonics) offer NMR imaging systems.

Even though the technology is presently available, NMR imaging systems are not readily available due to their high initial and operating costs. Initial capital outlays can be in the range of several millions of dollars for an NMR system. One factor leading to a high initial and maintenance cost is that the main magnets are superconductive and require liquid helium based refrigeration systems. Also, system operation and maintenance require highly skilled personnel. Many organizations, including the U.S. government, are attempting to keep medical costs under control. There is thus great difficulty in acquiring such systems, even in spite of the benefits to the community they would serve through their fantastic imaging power. Therefore, measures which will reduce the operating cost or increase the productivity of NMR imaging systems are needed.

OBJECTIVES OF THE INVENTION

A primary objective of the present invention is to provide a nuclear magnetic resonance imaging system which does not require strict uniformity in intensity or direction of the magnetic fields.

Another objective of the present invention is to provide an NMR imaging system which permits two patients to be exposed simultaneously.

A further objective of the invention is to increase by a factor of approximately 2 the productivity of a given NMR imaging installation by using two independent scanning systems with a common magnetic field source.

Another objective of the present invention is to provide an NMR imaging system which uses non-uniform magnetic field techniques to extend the imaging volume within a given NMR instrument, thus facilitating the exposure of two patients simultaneously.

A further objective of the present invention is to increase the productivity of NMR imaging systems by providing for the effectively simultaneous exposure of two patients.

A still further objective of the present invention is to extend the imaging volume of existing nuclear magnetic resonance imaging instruments.

Another objective of the present invention is to increase the imaging volume of a given magnet to permit the use of smaller, less costly magnets in NMR instruments.

Additional objectives of the invention will become apparent in light of the drawings and specification which follows.

SUMMARY OF THE INVENTION

This patent presents an NMR imaging system in which two patients are placed in a cylindrical gantry and separated by a radio frequency (RF) electromagnetic shield which is transparent to the imaging magnetic fields. In the preferred embodiment to be described, these magnetic fields are comprised of common static and gradient magnetic fields which encompasses everything within the gantry. A separate RF field is associated with each patient. Thus both patients are within a varying magnetic field generated by a common source but excited by separate means. Each patient is scanned by a separate imaging array which is responsive to an independent control system and provides data used to develop an independent display so that two technicians may simultaneously use the imaging system to process their respective patient by operating the system through their control and display console as if they had full control of the system and it was processing only their patient.

The imaging energy is created by magnetic fields which vary as a function of distance from the source so that the imaging energy at various points throughout the gantry varies. Normally this creates a situation where it is impossible to derive meaningful results from a scanner, however a variable compensation factor is incorporated in the computer processing system for the image data to compensate for these variations. Because of the complexity of the variations, the compensating function is developed by physically determining the imaging field intensity at discrete points throughout the imaging area.

DESCRIPTION OF THE INVENTION

This invention involves a special application of computerized tomography using nuclear magnetic resonance techniques in accordance with basic theories such as those summarized by W. S. Hinshaw and A. H. Lent in their joint paper presented at Pages 338 through 350 in the Proceedings of the IEE, Volume 71, Number 3, March 1983. These theories, which are generally known, form the basic foundation of knowledge upon which this invention is built. The advancement to the art presented by this invention allows for a relaxation of heretofor stringent requirements for uniformity in the intensity and direction of the magnetic field and this relaxation permits the development of systems such as those illustrated in FIG. 1.

Figure 1:
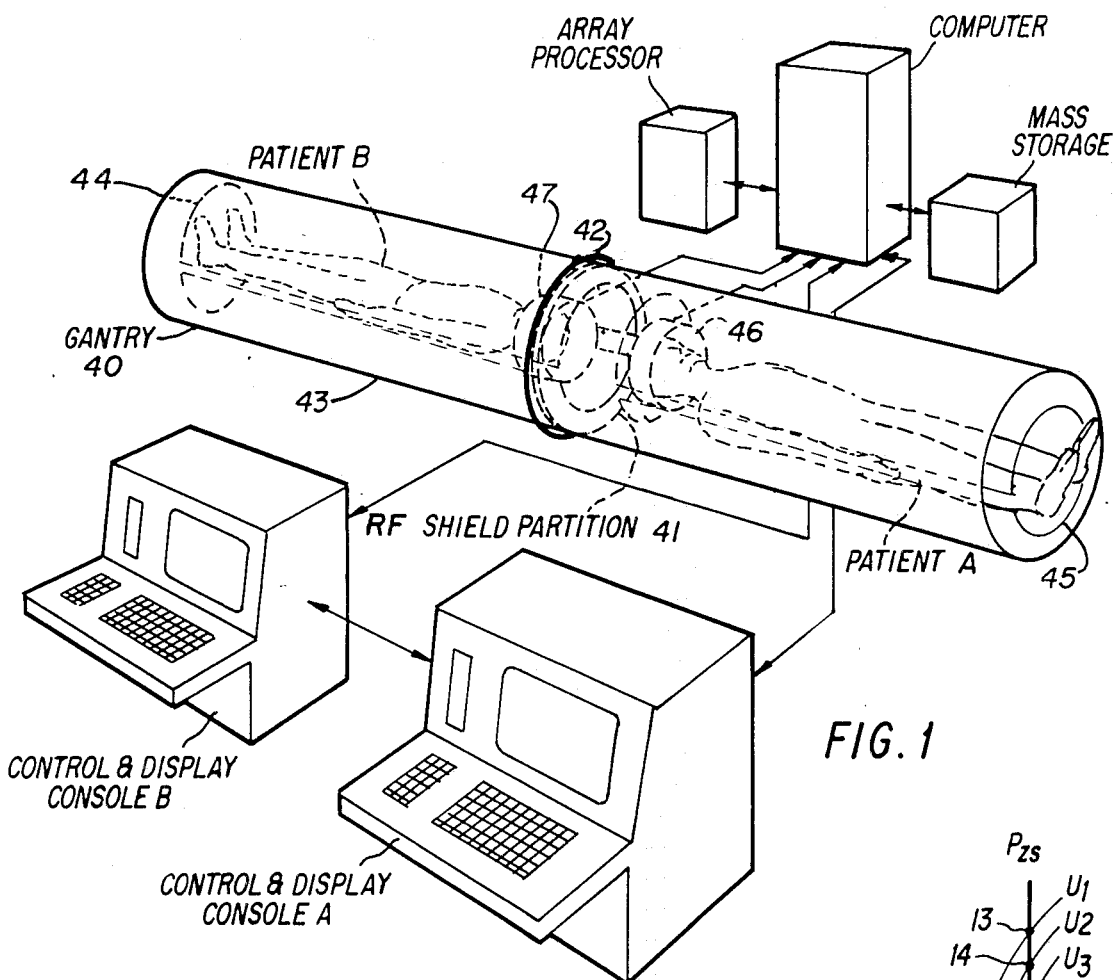
FIG. 1 is perspective view of a dual patient nuclear magnetic resonant imaging system.

FIG. 1 illustrates an NMR system which allows two patients to be disposed within the same cylindrical gantry 40. They are separated by a partition 41 which is an RF shield that is transparent to steady magnetic fields produced by the static field generator 42, (only one turn of which is shown) and gradient coils 43. RF field coils 44 and 45 perform the basic object excitation and sensing functions required for NMR imaging as specified by Hinshaw et al in the above referenced paper. Also shown in the figure are movable RF field generator and sensing coils, called head coils 46 and 47. These may be used with or in lieu of fixed RF field generator and sensing coils 44 and 45.

The system is controlled by two Control and Display Consoles. Console A, is primarily concerned with Patient A and Console B, with Patient B. These consoles can be co-located, or they can be in separate rooms. FIG. 1 omits all detailed information relating to the establishment of the magnetic field, since this would be accomplished in the well known way, using main magnets 42 and gradient field coils 43, and varying from the known system by the use of a plurality of RF field coils 44 and 45. Information derived from the RF Probes 46 and 47 is transmitted to the computer, which through the use of mass storage means and array processors, synthesizes the image from the signals received. The computer processes data from both stations in parallel (the images associated with Patient A and Patient B); it maintains a separate storage file for each patient and sends the appropriate image to the appropriate console. From the viewpoint of the console operator, the system responds his commands; the presence and demands of the other patient and operator are "transparent" to him. Thus, even though as described below, the data are not taken truly simultaneously, they appear to be so; that is why the term "effectively simultaneous" is used.

Figure 2:
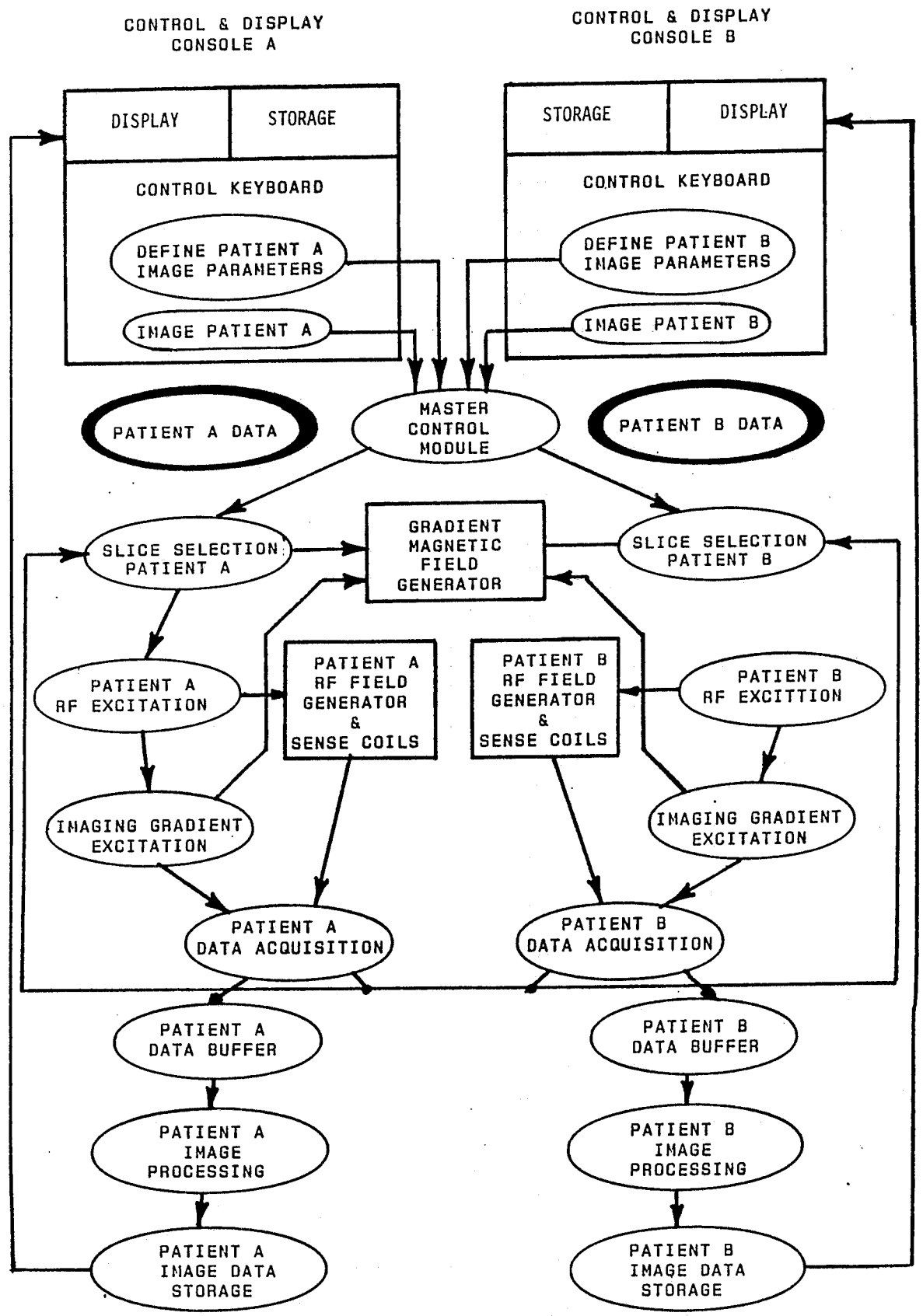
FIG. 2 is a flow diagram illustrating the program used to control the computer of the imaging system.

FIG. 2 illustrates the sequence of operations, including command, control, data acquisition and processing operations, within the overall system. The rectangular blocks represent hardware sub-systems. The ellipses show processes, whose physical manifestation is executed by the hardware systems. The ellipses not enclosed by a solid rectangle represent processes executed by the computer or data processor, in one of its peripherals or in the array processor(s). Control and display consoles A and B each include means through which the operator defines the parameters of the image he wishes to make. These parameters include patient data, "slice" orientation (axial, sagittal, coronal or oblique) and position, number of slices, display format, etc. Each control and display console also contains means through which the operator is able to control execution (start, stop, pause, delay) of the imaging process for his assigned patient. This is called the "IMAGE PATIENT" process which may be hardwired or in the form of a dedicated read only memory module or software program. The heart of the system is the computer which serves both patient A and B and provides operation instructions to both the common and patient independent NMR subsystems through the "MASTER CONTROL MODULE". This module receives the imaging parameters and operational commands from control and display modules A and B, and based on these data, controls the entire sequence of excitation and imaging operations which follow. Because there is only one set of magnetic field gradient coils, some of these operations must proceed in sequence, but because there are independent RF coils and co-processors in the computer system, many of the operations can proceed in parallel, i.e. simultaneously. In the normal sequence of operation, the appropriate magnetic field gradients and RF excitations are first applied to patient A, then to patient B. If only one patient is being imaged, the sequence would omit the unnecessary steps; i.e. the sequence could go either through the steps for patient A or B. The "DATA BUFFER", "IMAGE PROCESSING" and "IMAGE DATA STORAGE" sequences for each patient proceed asynchronously and in parallel. The major time requirement by far is found in the "IMAGE PROCESSING" modules. Since these processes are asynchronous, parallel and "off-line", the entire patient imaging sequence appears to be simultaneous, and the processing demands of each patient have little effect on the other.

The normal image excitation and processing methods used for each patient, i.e. "SLICE SELECTION", "RF EXCITATION" and "IMAGE GRADIENT EXCITATION", are "slice selection plus 2-D Fourier transformation" or "slice selection plus 2-D backprojection". However, other processing options, including "3-D backprojection" and "3-D Fourier transformation" are resident in the system. They are called from the master control module by the operators through their control consoles.

The images are stored by the appropriate "IMAGE DATA STORAGE" modules for patients A and B and are called to the display unit on consoles A or B by the respective "IMAGE PATIENT" modules.

In the present practice of nuclear magnetic resonance imaging, the requirement for spatial uniformity in the magnet field strength is very stringent. Allowed variation in field strength across the imaging volume, typically a 50 cm (19.7 inch) diameter sphere, can be the order of 25 ppm (parts per million). This stringency is a consequence of the imaging methods and algorithms used, which deal with planar slices through the imaged object.

The uniform, unidirectional magnet field of the present system in the imaging volume, in the absence of a gradient field, is expressed:

$$\vec{H}(\vec{X}) = H_o \vec{k} \tag{1}$$

where
$\vec{X}$ is the position vector;

$$\vec{X} = x\vec{i} + y\vec{j} + z\vec{k}$$

and
$H_o$ is the constant value of field intensity.
When the gradient field is turned on:

$$\vec{H}(\vec{X}) = (H_o + \vec{G}\cdot\vec{X})\vec{k} \tag{2}$$

$$\vec{G}\cdot\vec{X} = G_x x + G_y y + G_z z,$$

$G_x$, $G_y$, $G_z$ being the gradient field constants Eq. (2) defines surfaces of constant field intensity which are planes. In particular, if only one component of the gradient field is turned on at a time, $$\vec{H}(\vec{X}) = (H_o + G_x x)\vec{k} \tag{3a}$$

$$\vec{H}(\vec{X}) = (H_o + G_y y)\vec{k} \tag{3b}$$

$$\vec{H}(\vec{X}) = (H_o + G_z z)\vec{k} \tag{3c}$$

the planes lie perpendicular to the x, y and z axes respectively, thus defining sagittal, coronal and axial sections respectively. One method of imagine processing involves exciting, or rotating the precessing nuclei about either the i or j direction, by means of an rf pulse of the proper Larmor frequency such that a precise slice, in the form of a plane defined by one of the Eqs. (3), is chosen.

The present invention relaxes the requirement for uniformity and unidirectionality in the primary magnetic field and for the first order linearity of the gradient field. It retains the requirements that the deviations from planarity of the surfaces of constant field intensity be small. The present invention adds additional complexity to the image processing algorithms, basically adding an additional step, in return for greater simplicity in the magnet system. Stated another way, it trades off complexity and sophistication in the computer system for the magnet system. In view of the technological trends, the net economic change should result in significant cost savings.

In the present invention, the magnetic field, in the absence of a gradient field, is expressed:

$$\vec{H}(\vec{X}) = H_x(\vec{X})\vec{i} + H_y(\vec{X})\vec{j} + H_z(\vec{X})\vec{k} \tag{4}$$

That the deviations from unidirectionality are small is expressed by:

$$H_z(\vec{X}) >> [H_x^2(\vec{X}) + H_y^2(\vec{X})]^{\frac{1}{2}} \tag{5}$$

The magnitude of the field intensity is expressed:

$$H(\vec{X}) = [H_x^2(\vec{X}) + H_y^2(\vec{X}) + H_z^2(\vec{X})]^{\frac{1}{2}} \tag{6}$$

In view of Eq. (5), Eqs. (4) and (6) can be re-expressed in approximate form:

$$\vec{H}(\vec{X}) \approx H_z(\vec{X})\vec{k} \tag{7}$$

and $$H(\vec{X}) \approx H_z(\vec{X}) \tag{8}$$

In the presence of a non-uniform z-gradient field, $\vec{G}_z(\vec{X}) = G_{zx}(\vec{X})\vec{i} + G_{zy}(\vec{X})\vec{j} + G_{zz}(\vec{X})\vec{k}$, the total magnetic field becomes:

$$\vec{H}(\vec{X}) = H_x\vec{i} + H_y\vec{j} + [H_z(\vec{X}) + \vec{G}_z(\vec{X})\cdot\vec{X}]\vec{k} \tag{9}$$

Using the approximation (7), Eq. (9) can be approximated:

$$\vec{H}(\vec{X}) \approx [H_z(\vec{X}) + \vec{G}_z(\vec{X})\cdot\vec{X}]\vec{k} \tag{10}$$

We relax the linearity constraint from the z-gradient field, $G_z(X)$, but retain the symmetry properties. Then each of the components defined above may be approximated to second order as follows:

$$G_{zx}(\vec{X}) = a_{zx} + b_{zx}x^2 + c_{zx}y^2 + d_{zx}z^2 \tag{11a}$$

$$G_{zy}(\vec{X}) = a_{zy} + b_{zy}x^2 + c_{zy}y^2 + d_{zy}z^2 \tag{11b}$$

$$G_{zz}(\vec{X}) = a_{zz} + b_{zz}x^2 + c_{zz}y^2 + d_{zz}z^2 \tag{11c}$$

We observe that the surfaces of constant field intensity, as described either by the exact expression, Eq. (9), or by the approximation, Eq. (10), both invoking Eq. (11), are no longer necessarily planes, but rather generalized curvilinear surfaces. Because of the approximation, Eq. (5), the field direction remains "substantially" parallel to unit vector $\vec{k}$.

Figure 6:
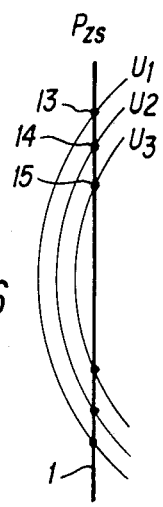
FIG. 6 is a vertical section through the rectification calibration membrane, indicating the intersections of curvilinear surfaces with the rectified planar surface of the membrane.
Figure 5:
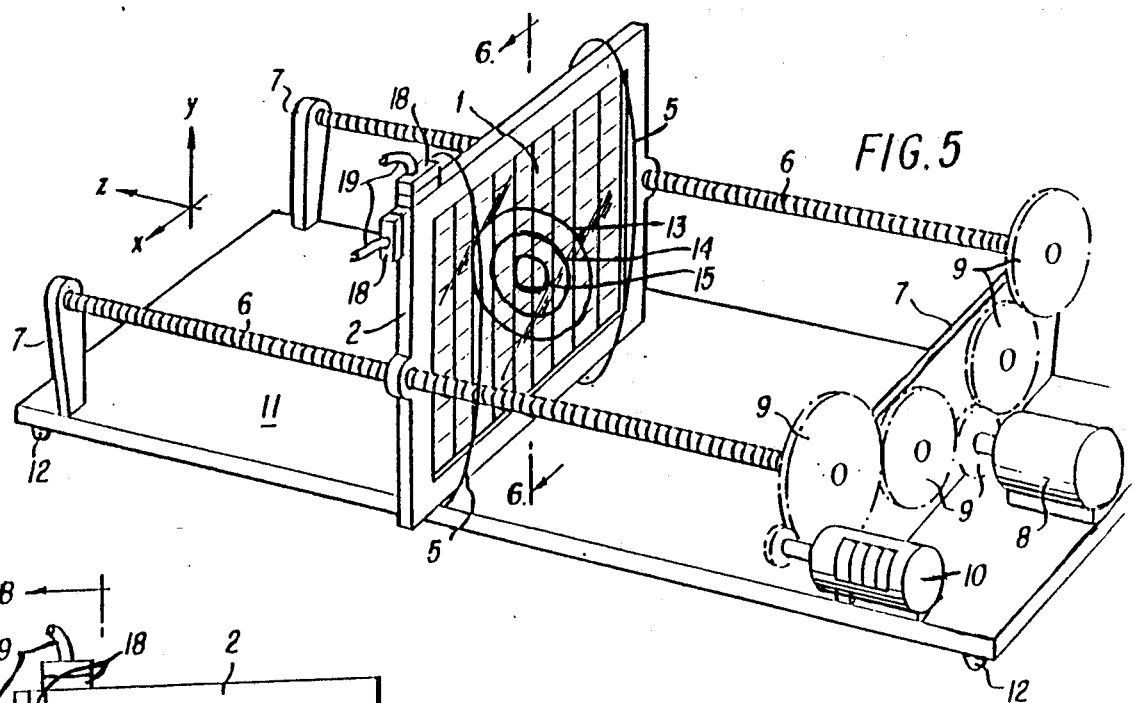
FIG. 5 is an isometric view of the mechanical elements of the rectification calibration system.

Suppose we are imaging nucleii of gyromagnetic ratio $\gamma$. Along the curvilinear surface defined by field intensity $H(\vec{X})$, these nucleii will precess about the direction of the magnetic field at the Larmor frequency, $\omega_0 = -\gamma H$. The essence of this invention is that the image formation is first conducted on a set of neighboring curvilinear surfaces, then the images thus defined are "rectified" to planar surfaces by a computational process to be described below. The curvilinear image formation process would follow standard MRI practices. For example, the original "slice selection" process may involve a curvilinear axial slice by initially applying only the $G_{zz}(\vec{X})$ gradient component, Eq. (11c), followed by a 90 degree rf pulse at the Larmor frequency through coils whose axes are oriented along the x-axis or y-axis. Once this "slice" is excited, image formation can take place using, for example, the 2-D Fourier method. (other methods, including 2-D or 3-D "backprojection", could be used alternatively.) The image formation and recovery process will remain valid, provided the curvature of the iso-intensity surfaces defined by Eqs. (9) or (10), with Eq. (11) invoked, is not "too large". Curvilinear image formation and recovery is not an object of this invention; we shall assume that curvilinear image formation can be accomplished by straightforward applications of existing techniques as noted above. Described below is a system and process to convert curvilinear surfaces of constant magnetic field strength, $H_o$, resulting from the application of the z-gradient field into images on flat planes of the usual axial, sagittal or coronal orientation, or of an oblique orientation. The intersections of exemplary iso-intensity surfaces $U_1$, $U_2$, $U_3$ with the rectification calibration membrane are shown in FIGS. 5 and 6 as 13, 14 and 15 respectively. FIG. 6 is a view of the iso-intensity surfaces $U_1$, $U_2$, and $U_3$ intersecting the planar surface $P_{zs}$. The process of converting a set of curvilinear surfaces into a single planar image is called "image rectification".

Rectification Calibration

Before the image rectification process can take place, rectification calibration, which is described in this section, must be accomplished.

Figure 3:
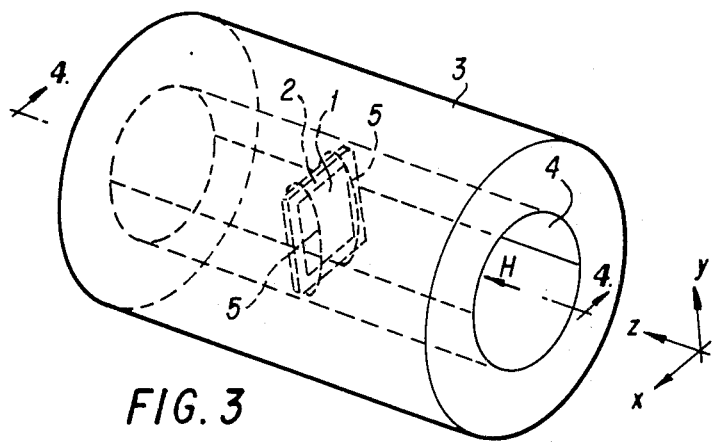
FIG. 3 is a perspective view of an NMR magnetic and imaging volume with parts of the rectification calibration system in place.
Figure 4:
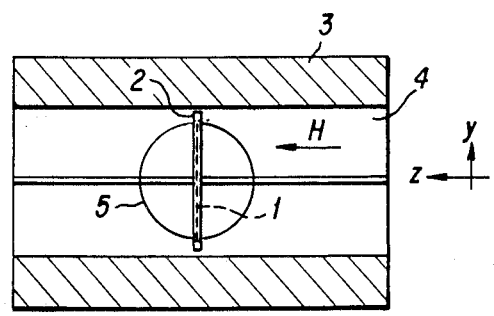
FIG. 4 is a vertical sectional view of FIG. 3 taken along line 4—4'.

Rectification calibration requires a thin membrane of imaging material oriented properly in the magnetic field within the imaging volume. This imaging material is a film material, typically about 1 mm in thickness and high in hydrogen content; polyethylene would make an acceptable imaging material, although such materials are not limited to polyethylene. FIG. 3 shows a perspective view of an NMR imaging volume 4 within an electromagnet 3. A thin membrane of rectification calibration material 1 is held within frame 2. A set of rf coils 5 is oriented substantially normally to the direction of the magnetic field H. FIG. 4 shows a vertical view of the same items. Frame 2, which holds the rectification calibration (rc) membrane 1, is supported and moved by helically threaded guide rods 6 which keep the plane of frame 2, and hence rc membrane 1, normal to magnetic field H. As shown in FIGS. 3 through 5, frame 2 and rc membrane 1 move in the z direction, while the axis of coil set 5 is oriented parallel to the x direction. (The axis of coil set 5 could just as well have been oriented parallel to the y direction; alternatively, there could be two sets of coils 5, one whose axis is parallel to the x direction and one whose axis is parallel to the y direction.) The motion of frame 2 and rc membrane 1 is effected by rotating threaded guide rods 6, by motor 8 via gear train 9. Counter 10 measures the total net rotation of guide rods 6, and hence the linear position of frame 2, and rc membrane 1, relative to chassis 11. Since chassis 11 is positioned positively and uniquely within imaging volume 4 by detents 12, counter 10 also measures the precise position of frame 2, and rc membrane 1, along the z coordinate of imaging volume 4.

Figure 7:
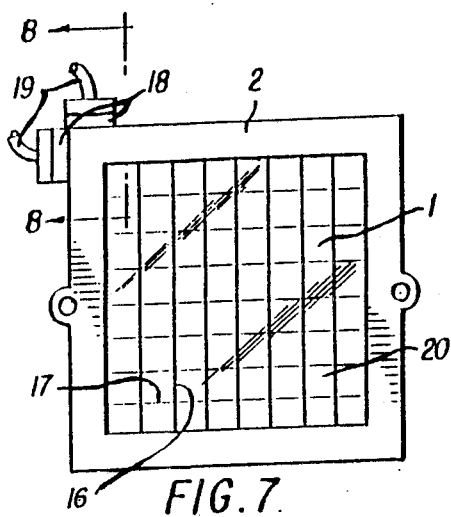
FIG. 7 illustrates the rectification calibration membrane frame assembly.
Figure 8:
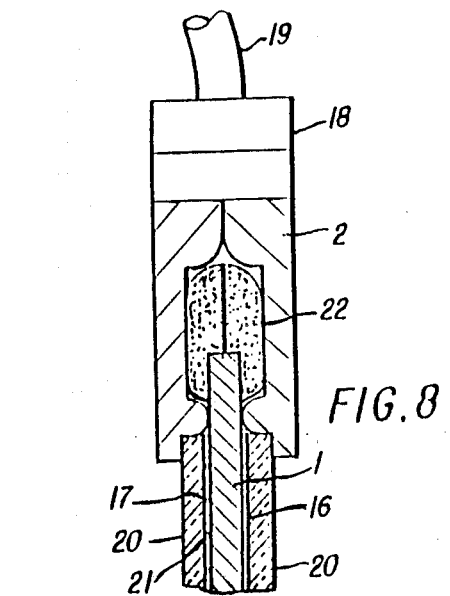
FIG. 8 is a partial section through FIG. 5 to expose the detail of construction of the rectification calibration membrane frame assembly.
Figure 9:
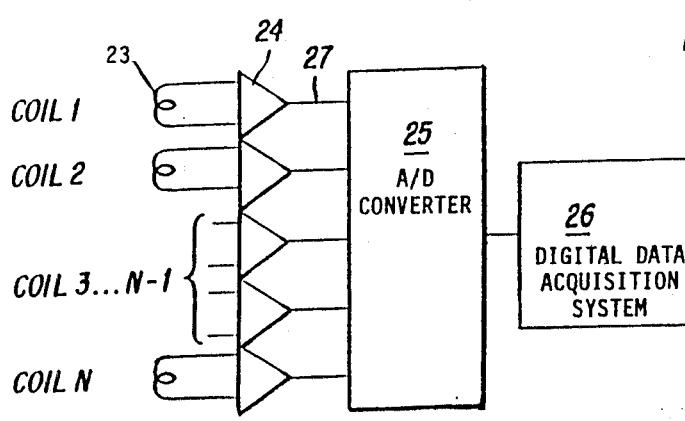
FIG. 9 is an electrical schematic showing the interfacing of each sensing coil in the calibration membrane frame assembly to the digital data acquisition system.

Lying on either surface (front and back) of rc membrane 1 are a set of orthogonally disposed wires, 16 and 17; see FIGS. 7 and 8. Wires 16 lie parallel to the y axis and wires 17 lie parallel to the x axis. At each location, wires 16, lying on either surface (front and back) of rc membrane 1, form a complete circuit, thereby constituting a sensing coil 23; see FIG. 9. The same is true of wire 17, lying in a direction normal to wires 16. Sensing coils 23 may consist of a multiplicity of turns (varying from one to many) of wires 16, or wires 17. As will be described further below, the purpose of sensing coils 23 is to sense and locate, in both x and y coordinate, the excited and precessing element of magnetization p (see FIG. 10) within rc membrane 1. (The sensing coils 23 could also be used to send the rf excitation pulse provided by rf coil set 5; but this may require them to be of too large a wire size. But in this sense, coils 23 are redundant to rf coil set 5.) As may be seen in FIG. 8, wires 16 and 17, lie within precise grooves 21, etched or ground, on the surface of glass panes 20, whose purpose is to protect these delicate wires, 16 and 17, as well as rc membrane 1, from damage. Membrane clamp 22 hold rc membrane 1, and through scribed grooves (not shown) guides and defines the x position of each wire 16, and the y position of each wire 17. Membrane clamp 22 is held together by frame 2, which also provides for the support of glass panes 20. Connectors 18, which provide an electrical interface for each set of coils 23 (one set along the x axis, wires 16, and one set along the y axis, wires 17) to the electronics data acquisition and processing system downstream. Electrical cable 19 contains one coaxial cable, or one twisted shielded pair of wires, for each of the sensing coils 23 and conducts the signal to preamplifiers 24 and thence via high level analog signal wires 27 to multi-channel, high speed A/D converter 25, where the analog data are converted to a digital time series. This multiplexed set of time series proceeds to digital data acquisition system 26, which is part of the electronics for the rectification calibration system. Analog diagnostic access to the high level analog signals can be obtained on analog signal wires 27.

We shall now describe how the sensing coils 23 may be used to locate the excited, precessing magnetization element within rc membrane 1. We define the planar surface normal to the z axis, and located at position s along the z axis, as $P_{zs}$. Let the coordinates on the $P_{zs}$ plane be $X_s$ and $Y_s$. We define the previously described curvilinear surfaces of constant magnetic field strength, $H_o$, resulting from the application of the z-gradient field component $G_{zz}$, Eq. (11c), of arbitrary magnitudes 1, 2, 3 etc., as $U_1$, $U_2$, $U_3$, etc. Let the coordinates on the $U_j$ plane be $V_j$ and $W_j$. The purpose of rectification calibration is to define the functional relationship: $X_s(V_j, W_j)$ and $Y_s(V_j, W_j)$ for $j = 1, 2 \ldots M$.

Figure 10:
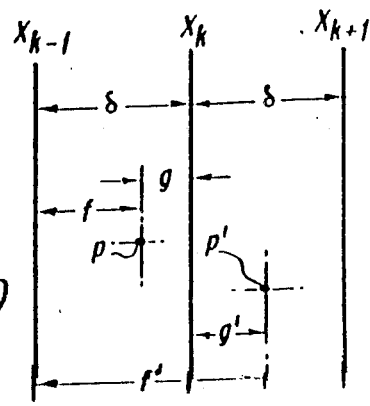
FIG. 10 illustrates the relative location of the magnetization element P and a related ambiguous element P'.

Let the signal in sensing coil 23, of wires 16, located at x-coordinate k be $e_k$. Refer to FIG. 10. This signal is from precessing magnetization element p in rc membrane 1. Let the signal from the same element sensed in sensing coils 23, located at x-coordinates $X_{k-1}$ and $X_{k+1}$, be $e_{k-1}$ and $e_{k+1}$ respectively. The x-coordinate of p, i.e. $X_{k-1} + f$, is determined by the ratio, $R_{k-1/k} = e_{k-1}/e_k$. The position of p is not necessarily a linear function of $R_{k-1/k}$, but must be determined experimentally, by placing rc membrane 1 within an NMR planar system (i.e. one using a uniform magnetic field) which is calibrated and working. FIG. 10 also shows that the same ratio $R_{k-1/k}$ could result from an ambiguous element p′ (because the ratio g/f = the ratio g′/f′). This ambiguity is removed by bringing in the signal from the sensing coils 23, located at x-coordinate $X_{k+1}$. Thus, the ratio $R_{k+1/k}$, removes the position ambiguity from the location of the precessing element of magnetization in rc membrane 1.

By thus locating the x and y coordinates of each excited, precessing element of magnetization within rc membrane 1, we are able to derive the required functional relationships $X_s(V_j, W_j)$ and $Y_s(V_j, W_j)$ for $j = 1, 2 \ldots M$.

The intersection (13, 14 or 15 of FIGS. 5 and 6) of the planar surface $P_{zs}$ by a surface of constant field intensity, $H_o$, (defined by magnitude j of z-gradient field component $G_{zz}$), is defined as follows:

$$i_{zsj} = P_{zs} \cdot U_j \qquad (12)$$

This intersection is measured by the method of slice excitation and sensing via coil set 5 and sensing via sensing coils 23, as described above, followed by the imaging process of either (a) 2-D backprojection, or (b) 2-D Fourier analysis on the slice thus excited (defined by $U_j$).

Through repeated application of this method of intersection measurement, eventually the entire $P_{zs}$ plane is filled by intersections, i.e.

$$i_{zs} = \sum_j i_{zsj} = P_{zs} \cdot \sum_j U_j = P_{zs}. \tag{13}$$

The function $i_{zs}$, which is called the plane $P_{zs}$ image projection function, is computed by the process described above and stored in computer memory.

Planar Image Rectification

Let the image on curvilinear surface $U_j$ be defined as $I(U_j)$. The corresponding, projected image on plane $P_{zs}$ is defined as $I(P_{zs}|U_j)$.

$$I(P_{zs}|U_j) = i_{zsj} I(U_j) \tag{14}$$

The complete image on plane $P_{zs}$ is derived by summing Eq. (14) through all curvilinear surfaces, $U_j$, which intersect plane $P_{zs}$:

$$I(P_{zs}) = \sum_j I(P_{zs}|U_j) = \sum_j i_{zsj} I(U_j) \tag{15}$$

Figure 11:
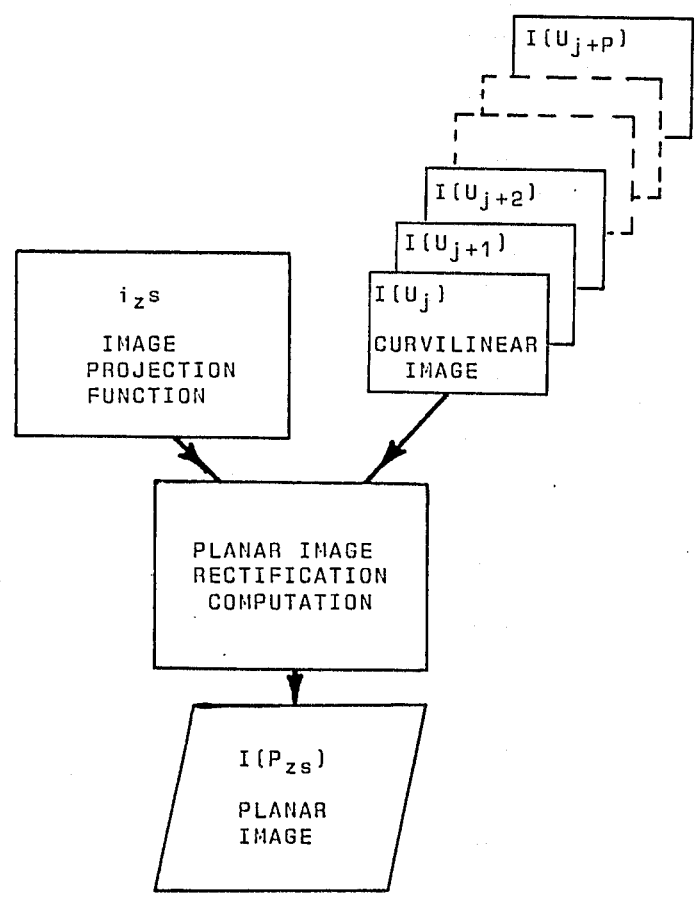
FIG. 11 is a program flow chart depicting the planar image rectification process.
Figure 12:
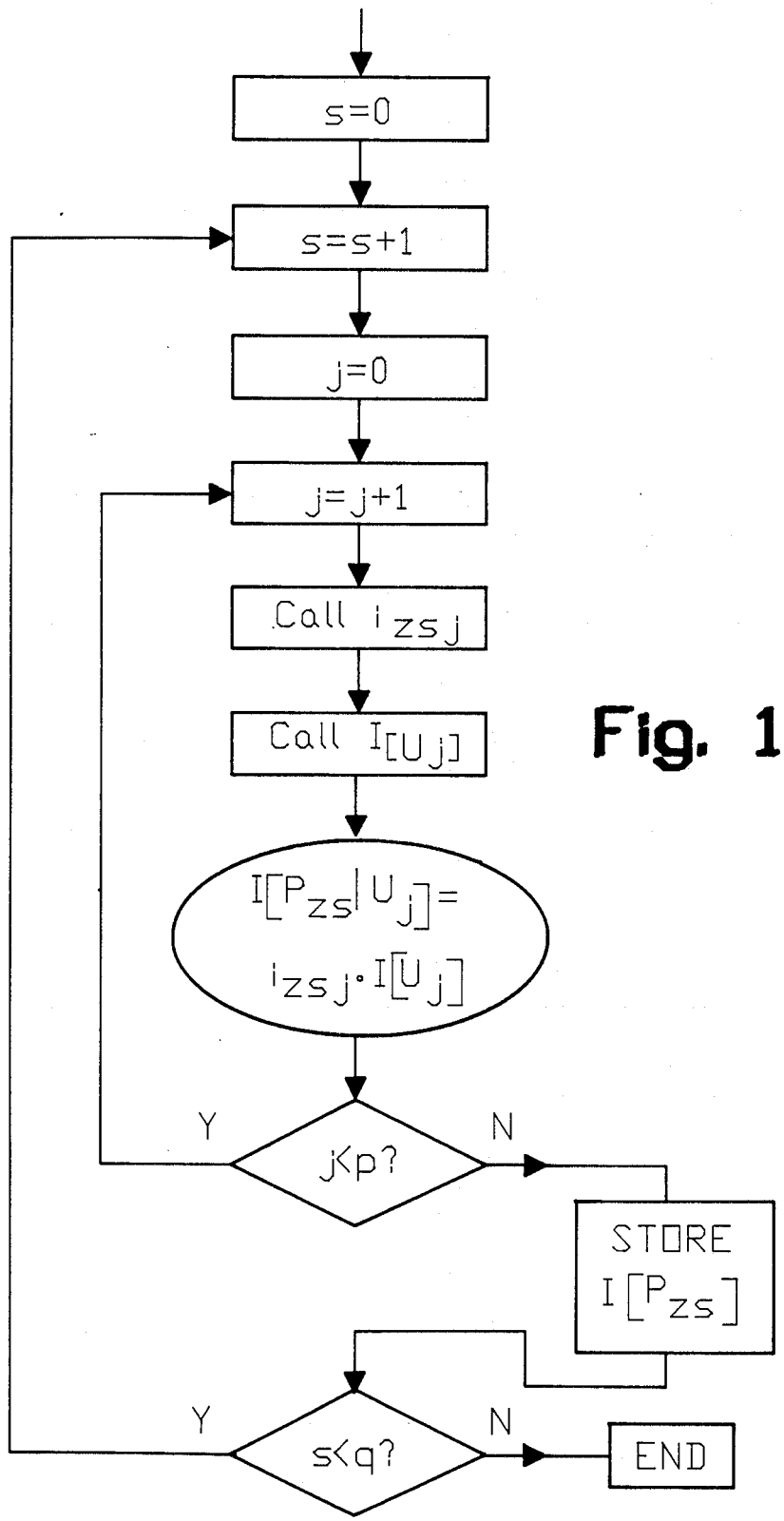
FIG. 12 is a generalized program flow chart.

Eq. (15) describes the process which takes place in the computer. The initial image formation occurs on the curvilinear surfaces, $U_j$. (In the systems currently available, the initial image formation takes place on planar surfaces; thus the process of rectification described by Eq. (15) is not required. On the other hand usable imaging volumes are small and magnet systems are large and costly. The process of Eq. (15) is thus at the core of this invention.) Each curvilinear image $I(U_j)$ is partially projected on to planar surface $P_{zs}$ through projection function $I_{zsj}$. When all curvilinear surface images which intersect zs planar surface $P_{zs}$ have been so projected, the image $I(P_{zs})$ is complete. The general computer image rectification process is diagrammed in FIGS. 11 and 12.

We have described above the rectification of images to axial sectional planes, $P_{zs}$. Similar processes can yield direct rectification of images to sagittal sectional planes, $P_{xs}$, or to coronal sectional planes, $P_{ys}$. To accomplish this, the calibration system diagrammed in FIGS. 3 through 6 must alter its planar orientation as well as the axes of guide rods 6 and associated mechanisms. Also, in the slice excitation process, the z-gradient component used to define curvilinear surfaces of constant field strength, $H_o$, would become $G_{zx}$ or $G_{zy}$ (see Eqs. (11a) and (11b)) for sagittal or coronal sections respectively. The principles remain the same.

We claim:

1. An imaging apparatus, comprising:
   means for generating a gradient magnetic field encompassing objects to be imaged;
   means for establishing a static magnetic field within said gradient magnetic field;
   means for generating an RF field within said gradient magnetic field;
   a plurality of RF field sensing means;
   means transparent to magnetic fields for providing an RF shield between individual RF field sensing means of said plurality of RF field sensing means; and
   an imaging system for producing a separate image from data derived from each of said RF field sensing means.

2. An imaging apparatus as defined in claim 1, wherein said means for generating an RF field comprises a plurality of RF field generators corresponding in number to said plurality of RF field sensing means.

3. An imaging apparatus as defined in claim 2, wherein said RF filed generators and said RF field sensing means are positioned in cooperative sets, further comprising:
   RF shield means for isolating each of said RF field generators and sensing sets from the other of said RF field generators and sensing sets; and
   said RF shield means is transparent to said gradient magnetic field and said static magnetic field.

4. An imaging apparatus as defined in claim 1 wherein said imaging system comprises;
   a plurality of operator terminals, each including an image display means and a control means;
   a data processing means responsive to each of said control means for controlling said means for generating a gradient magnetic field and said means for generating an RF field; and
   means included in said data processing means for independent acquisition and processing of data produced by each RF field sensing means of said plurality of RF field sensing means.

5. An imaging apparatus as defined in claim 1, including a rectification calibration apparatus comprising:
   a thin membrane of imaging material;
   means for positioning said imaging material within said gradient magnetic field;
   means for electromagnetically exciting said imaging material; and
   electromagnetic field sensing means for sensing excitation of said imaging material.

6. A nuclear magnetic resonance imaging system as defined in claim 5, wherein said means for generating an RF field comprises a plurality of RF field generators corresponding in number to said plurality of RF field sensing means.

7. A nuclear magnetic resonance imaging system as defined in claim 6, wherein said RF field generators and said RF field sensing means are positioned in cooperative sets, further comprising:
   an RF shield for isolating each of said RF field generator and sensing sets from the other of said RF field generator and sensing sets; and said RF shield is transparent to said gradient magnetic field and said static magnetic field.

8. A nuclear magnetic resonance imaging system as defined in claim 5, wherein said imaging system comprises:
   a plurality of operator terminals, each including an image display means and a control means;
   a data processing means responsive to each of said control means for controlling said means for generating a gradient magnetic field and said means for generating an RF field; and
   means included in said data processing means for independent acquisition and processing of data produced by each RF field sensing means of said plurality of RF field sensing means.

9. A nuclear magnetic resonance imaging system as defined in claim 8 wherein said data produced by each of said field sensing means represents curvilinear image data representing iso-intensity surfaces.

10. A nuclear magnetic resonance imaging system as defined in claim 9, wherein said electromagnetic field sensing means supplies reference data representing the excitation of said imaging material to said data processing means; and
    said data processing means further comprises means for creating a rectification calibration function from said reference data for converting said curvilinear data into data representing a planar image.

11. A nuclear magnetic resonance imaging system, comprising:
   means for generating a gradient magnetic field encompassing objects to be imaged;
   means for establishing a static magnetic field within said gradient magnetic field;
   means for generating an RF field within said gradient magnetic field;
   RF field sensing means;
   a data processing system for producing images from data derived from said RF field sensing means; and
   means for generating reference data representing discreet points of iso-intensity surfaces, including: a thin membrane of imaging material;
   means for positioning said imaging material within said gradient magnetic field;
   means for electromagnetically exciting said imaging material, and
   electromagnetic field sensing means for sensing excitation of said imaging material.

12. A nuclear magnetic resonance imaging system as defined in claim 11 wherein said data produced by said RF field sensing means represents curvilinear image data defining iso-intensity surfaces and said images are produced by said data processing means by adjusting said curvilinear image data by functions derived from said reference data.

13. A nuclear magnetic resonance imaging system including a rectification calibration apparatus comprising:
   a sheet of imaging material;
   means for positioning said sheet of imaging material within the imaging volume of said nuclear magnetic resonance imaging system;
   means for exciting said imaging material with electromagnetic energy; and
   means for sensing the extent of excitation of said imaging material by said electromagnetic energy.

14. A nuclear magnetic resonance imaging system as defined in claim 13 wherein said means for exciting said imaging material includes a coil oriented normal to the direction of the static magnetic field within said imaging volume.

15. A nuclear magnetic resonance imaging system as defined in claim 14 wherein said means for sensing the extent of excitation of said imaging material is comprised of a plurality of RF sensing coils encircling said sheet of imaging material and positioned to lie adjacent to the front and back sides of said imaging material.

16. A nuclear magnetic resonance imaging system as defined in claim 15 wherein said plurality of RF sensing coils is comprised of first and second groups of coils oriented relative to each other so that individual coils of said first group intersect individual coils of said second group.

17. A nuclear magnetic resonance imaging system as defined in claim 16 wherein said first and second groups of RF sensing coils are positioned normal to each other to form a grid of RF sensing coils.

18. A nuclear magnetic resonance imaging system as defined in claim 17 wherein the individual RF sensing coils of each of said first and second group of RF sensing coils are spaced equidistant from adjacent sensing coils within said group.

19. A nuclear magnetic resonance imaging system as defined in claim 18, including a frame supporting said sheet of imaging material, said means for sensing the extent of excitation of said imaging material and said means for exciting said imaging material.

20. A nuclear magnetic resonance imaging system as defined in claim 19 wherein said means for positioning said sheet of imaging material includes drive means for transporting said frame to incremental positions within said imaging volume.

21. A nuclear magnetic resonance imaging system as defined in claim 20, wherein said sheet of imaging material is in the form of a film having a high hydrogen content, further comprising first and second glass panes positioned adjacent to said film and forming a laminate structure comprised of said first glass pane, a portion of each of said sensing coils, said film, a second portion of each of said sensing coils, and said second glass pane.

22. A method for nuclear magnetic resonance imaging, including the steps of:
   generating a rectification calibration function for converting data representing curvilinear surfaces of constant magnetic field strength into a single planar image by a method including the steps of positioning a film of image material at a plurality of identifiable positions throughout the imaging volume of a nuclear magnetic resonance imaging system, exciting said film at each incremental position with electromagnetic energy, determining the state of excitation of said film at a plurality of points for each of said incremental positions, and generating a conversion function for each of said points on said film for each of said incremental positions;
   exciting an object to be imaged in said nuclear magnetic resonance imaging system with a source of RF energy;
   sensing variations in said resultant RF field caused by the nuclear magnetic resonance of the object being imaged and interpreting said variations as image data comprised of a plurality of curvilinear surfaces each of independent but constant magnetic field strength; and
   modifying said curvilinear image data into planar image data by application of said rectification calibration function.

23. A method for nuclear magnetic resonance imaging as defined in claim 22 wherein said image data is comprised of a plurality of discrete data points and said step of modifying said curvilinear image data includes the step of adjusting each data point by the specific rectification calibration function representing the equivalent three dimensional point within said imaging volume.

* * * * *

UNITED STATES PATENT AND TRADEMARK OFFICE
CERTIFICATE OF CORRECTION

PATENT NO. : 4,668,915

DATED : May 26, 1987

INVENTOR(S) : Scott C. Daubin et al.

It is certified that error appears in the above-identified patent and that said Letters Patent is hereby corrected as shown below:

On the title page, Item [73] should read

-- [73] Assignee: Medical Imaging Technology Incorporated, Key Biscayne, Florida --.

"Attorney, Agent, or Firm--Lyon & Lyon" should read

-- Attorney, Agent, or Firm---Harold A. Gell --.

Signed and Sealed this

Twenty-fourth Day of May, 1988

*Attest:*

DONALD J. QUIGG

*Attesting Officer*  *Commissioner of Patents and Trademarks*